United States Patent
Miyamae

(10) Patent No.: US 11,201,617 B1
(45) Date of Patent: Dec. 14, 2021

(54) LOCAL INTERCONNECT NETWORK (LIN) DRIVER CIRCUIT

(71) Applicant: Cypress Semiconductor Corporation, San Jose, CA (US)

(72) Inventor: Toru Miyamae, Aichi (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/188,890

(22) Filed: Mar. 1, 2021

Related U.S. Application Data

(62) Division of application No. 16/910,367, filed on Jun. 24, 2020, now Pat. No. 10,938,387.

(51) Int. Cl.
*H03K 17/16* (2006.01)
*H04L 12/46* (2006.01)
*H04L 12/40* (2006.01)

(52) U.S. Cl.
CPC .......... *H03K 17/165* (2013.01); *H04L 12/40* (2013.01); *H04L 12/46* (2013.01)

(58) Field of Classification Search
CPC ........ H03K 17/165; H04L 12/40; H04L 12/46
USPC .................. 327/108–112; 326/82, 83, 87, 88
See application file for complete search history.

(56) References Cited

U.S. PATENT DOCUMENTS

| | | | |
|---|---|---|---|
| 6,949,963 B2 | 9/2005 | Haas et al. | |
| 6,989,694 B2 * | 1/2006 | Garnier | H03K 4/50 327/142 |
| 7,352,216 B2 * | 4/2008 | Hershbarger | H03K 4/48 327/131 |
| 7,885,047 B2 | 2/2011 | Deval et al. | |
| 7,940,076 B2 | 5/2011 | Chimakurthy et al. | |
| 8,334,758 B2 | 12/2012 | Baruco et al. | |
| 8,462,473 B2 | 6/2013 | Deval et al. | |
| 8,508,282 B2 | 8/2013 | Sicard | |
| 9,607,978 B2 | 3/2017 | Deval et al. | |
| 9,735,820 B2 | 8/2017 | Deval et al. | |
| 9,816,375 B2 * | 11/2017 | Chimakurthy | E21B 47/12 |
| 10,169,278 B2 | 1/2019 | Mori et al. | |

(Continued)

FOREIGN PATENT DOCUMENTS

| | | |
|---|---|---|
| CN | 103684398 A | 3/2014 |
| CN | 103346774 B | 4/2016 |
| DE | 102014225354 A1 | 6/2016 |

OTHER PUBLICATIONS

Jean-Michel Redoute, "An EMI Resisting LIN Driver in 0.35-micron High-Voltage CMOS," IEEE Journal of Solid-State Circuits, vol. 42, No. 7, Jul. 2007; 9 pages.

(Continued)

*Primary Examiner* — Tomi Skibinski

(57) ABSTRACT

A driver circuit and corresponding methods and systems are disclosed, the driver circuit comprises a signal generation circuit to generate a linearly varying signal at a first node based on a clock signal and an output transistor to receive the linearly varying signal and output a drive signal to a bus. A buffer amplifier is coupled between the first node and a gate of the output transistor to disable the gate capacitance of the output transistor. The driver circuit further comprises a capacitor coupled between the first node and a feedback node of the driver circuit such that the Miller effect occurs at the capacitor and a slew rate for the drive signal is generated at the feedback node.

16 Claims, 17 Drawing Sheets

(56) References Cited

U.S. PATENT DOCUMENTS

2010/0308859 A1* 12/2010 Chimakurty ... H03K 19/018521
　　　　　　　　　　　　　　　　　　　326/27
2011/0291733 A1* 12/2011 Yano ................ H03K 19/00361
　　　　　　　　　　　　　　　　　　　327/306
2014/0266106 A1*　9/2014 El-Nozahi ............... G05F 1/573
　　　　　　　　　　　　　　　　　　　323/280

OTHER PUBLICATIONS

USPTO Notice of Allowance for U.S. Appl. No. 16/910,367 dated Nov. 3, 2020; 9 pages.
USPTO Requirement for Restriction Election for U.S. Appl. No. 16/910,367 dated Aug. 17, 2020; 6 pages.

* cited by examiner

LOCAL INTERCONNECT NETWORK (LIN) DRIVER CIRCUIT

RELATED APPLICATIONS

This Application is a Divisional of U.S. patent application Ser. No. 16/910,367, filed on Jun. 24, 2020, which is hereby incorporated by reference herein in its entirety.

TECHNICAL FIELD

The present disclosure relates generally to line driver circuits, and more particularly to a local interconnect network (LIN) driver circuit that does not require phase compensation and provides a high level of electromagnetic interference (EMI) tolerance.

BACKGROUND

Line driver circuits are used for driving many different types of buses or networks. An example of such a network is a LIN ("Local Interconnect Network"), which is a single-wire, serial communications protocol that is low cost, low speed (e.g., maximum transmission speed=20 kbit/s), and is often intended to be used for distributed electronic systems in a variety of applications, such as automotive electronics. A number of these applications involve electromagnetic compatibility (EMC) requirements that must be met, including automotive electronics, for example. One of the key concepts behind the physical layer of a LIN is a high level of electromagnetic noise tolerance, without in turn generating excessive electromagnetic interference (EMI) which could disturb neighboring circuits. As a result, LINs are a valuable communication system, not only in automotive applications, but also in many other applications such as home appliances.

In order to comply with EMI emission standards, a line driver circuit for a LIN (hereinafter referred to as a "LIN driver") must meet certain requirements with regard to the slope of the output signal it provides to the LIN (e.g., via a LIN bus). Indeed, as the slope of the output signal becomes steeper, more high frequency (HF) components may be generated in the signal spectrum. Thus, the output signal shape should be carefully selected in order to reduce EMI on one hand and allow for bit rates up to 20 kbit/sec on the other. For this reason, the slope (or, slew rate) of the LIN driver output signal must be controlled and set to an appropriate value. This operation is commonly referred to as slew rate control or slope control. This slope time must furthermore be independent of the battery voltage and the load (the total number of nodes in the LIN may vary, and so the correct load is not always known a priori). In order to allow a correct data transmission, the duty cycle of the output signal on the LIN bus must not be corrupted by EMI.

BRIEF DESCRIPTION OF THE DRAWINGS

The present embodiments are illustrated by way of example, and not of limitation, in the figures of the accompanying drawings.

DETAILED DESCRIPTION

In the following description, for purposes of explanation, numerous specific details are set forth in order to provide a thorough understanding of the present embodiments. It will be evident, however, to one skilled in the art that the present embodiments may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment. The phrase "in one embodiment" located in various places in this description does not necessarily refer to the same embodiment.

LIN driver circuits require high voltage (HV) capacitors to provide phase compensation for the buffer amplifier of the LIN driver. Phase compensation is a technique used in amplifiers, and especially in amplifiers employing negative feedback, that avoids unintentional creation of positive feedback, which will cause the amplifier to oscillate. Phase compensation also controls overshoot and ringing in the amplifier's step response. However, the use of HV capacitors decreases the EMI tolerance of the LIN driver circuit, and increases the manufacturing cost due to the large area required for such capacitors.

The embodiments described herein are directed to a driver circuit comprising a signal generation circuit to generate a linearly varying signal at a first node based on a clock signal and an output transistor to receive the linearly varying signal and output a drive signal to a bus. A buffer amplifier is coupled between the first node and a gate of the output transistor to disable the gate capacitance of the output transistor. The driver circuit further comprises a capacitor coupled between the first node and a feedback node of the driver circuit such that the Miller effect occurs at the capacitor and a slew rate for the drive signal is generated at the feedback node. As a result, the driver circuit does not require HV capacitors and does not have capacitive paths for EMI noise from the bus. Other advantages may be achieved alternatively or in addition to the advantages described herein.

Figure 1A:
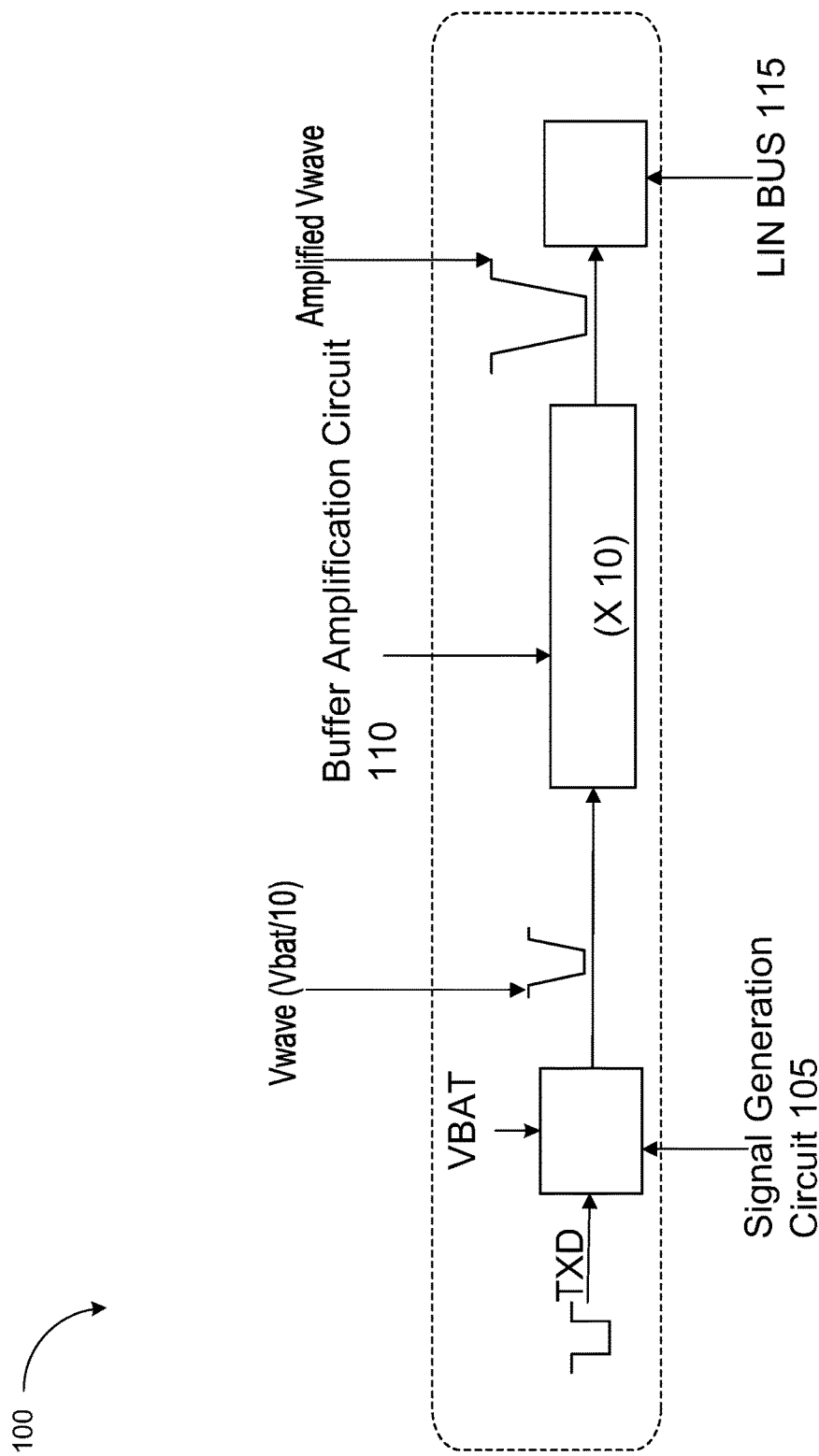
FIG. 1A is a block diagram illustrating a simplified LIN driver circuit, in accordance with some embodiments of the present disclosure.

FIG. 1A is a block diagram of a simplified illustration of one embodiment of a LIN driver circuit 100. It should be noted that although discussed herein in terms of a LIN driver circuit, the embodiments described herein are not limited to LIN driver circuits and may apply to driver circuits for a variety of different types of buses or networks. The LIN driver circuit 100 may comprise a signal generation circuit 105, a buffer amplification circuit 110, and a LIN bus 115. The TXD signal may be any appropriate clock signal, and is shaped into a signal (waveform) referred to as Vwave that is one-tenth of the battery voltage (VBAT). The feedback voltage (shown in FIG. 1B as Vfb) is one-tenth of the voltage on the LIN bus 115. The buffer amplification circuit 110 controls the gate of an output transistor (shown in FIG. 1B) to match the Vwave and the Vfb. Therefore, the Vwave is multiplied by ten and is output to the LIN bus 115.

Figure 1B:
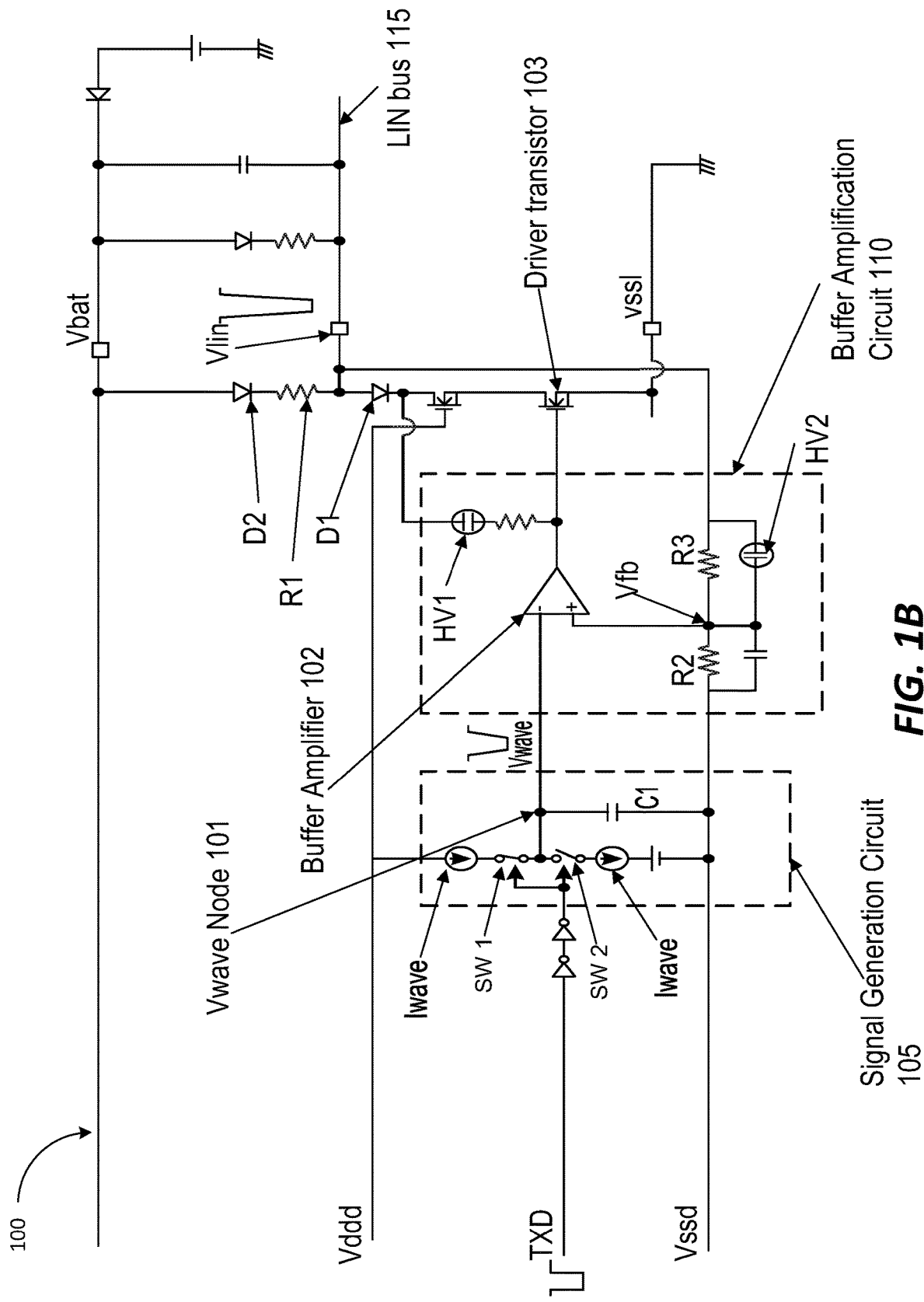
FIG. 1B is a block diagram illustrating a detailed LIN driver circuit, in accordance with some embodiments of the present disclosure.

FIG. 1B is a block diagram of a detailed view of the LIN driver circuit 100. Discussion of details such as bias circuits and offset voltages have been omitted for ease of description and illustration. The signal generation circuit 105 may include constant current source Iwave, that is coupled in series with switches SW 1 and SW 2. The switches SW 1 and SW 2 may employ current Iwave as a charging/discharging current that generates the signal Vwave at Vwave node 101. Vwave is provided to the driver transistor 103 through buffer amplification circuit 110.

In order to charge/discharge to the Vwave node 101, switches SW 1 and SW 2 may be intermittently switched on and off, thereby switching between Iwave as the charging current and Iwave as the discharging current applied to the Vwave node 101. TXD may provide an appropriate clock signal for the operation of the switches SW 1 and 2. For example, switch SW 1 is switched on and switch SW 2 is off during the charging phase (when TXD is low), and switch SW 2 is switched on and switch SW 1 is off during the discharging phase (when TXD is high). By intermittently switching the switches SW 1 and SW 2 on and off, a linearly varying voltage (Vwave) is created across the capacitor C1. Capacitor C1 may absorb the gate coupling EMI of the driver transistor 103, and provide a smoothing function for the Vwave signal.

The buffer amplifier 102 may be coupled across the gate and drain of the driver transistor 103 so that driver transistor 103 provides a controlled (and linear) slope signal (Vlin) which is fed through diode D1 to an output of the LIN driver circuit 100, such as the LIN bus 115 (e.g., via an output pin of a package of the LIN driver circuit 100). Driver transistor 103 may be any appropriate type of transistor. Diodes D1 and D2 may prevent interferences from coupling into the supply voltage Vbat (during a positive swing) and into the ground Vssd (during a negative swing). Although illustrated as diodes, any suitable elements or circuits may be used to prevent interferences from coupling into the supply voltage. Resistor R1 (between the diodes D1 and D2) may represent an internal pull up resistance (e.g., 30 kΩ). R2 and R3 may be feedback resistors for the buffer amplification circuit 110.

Figure 2A:
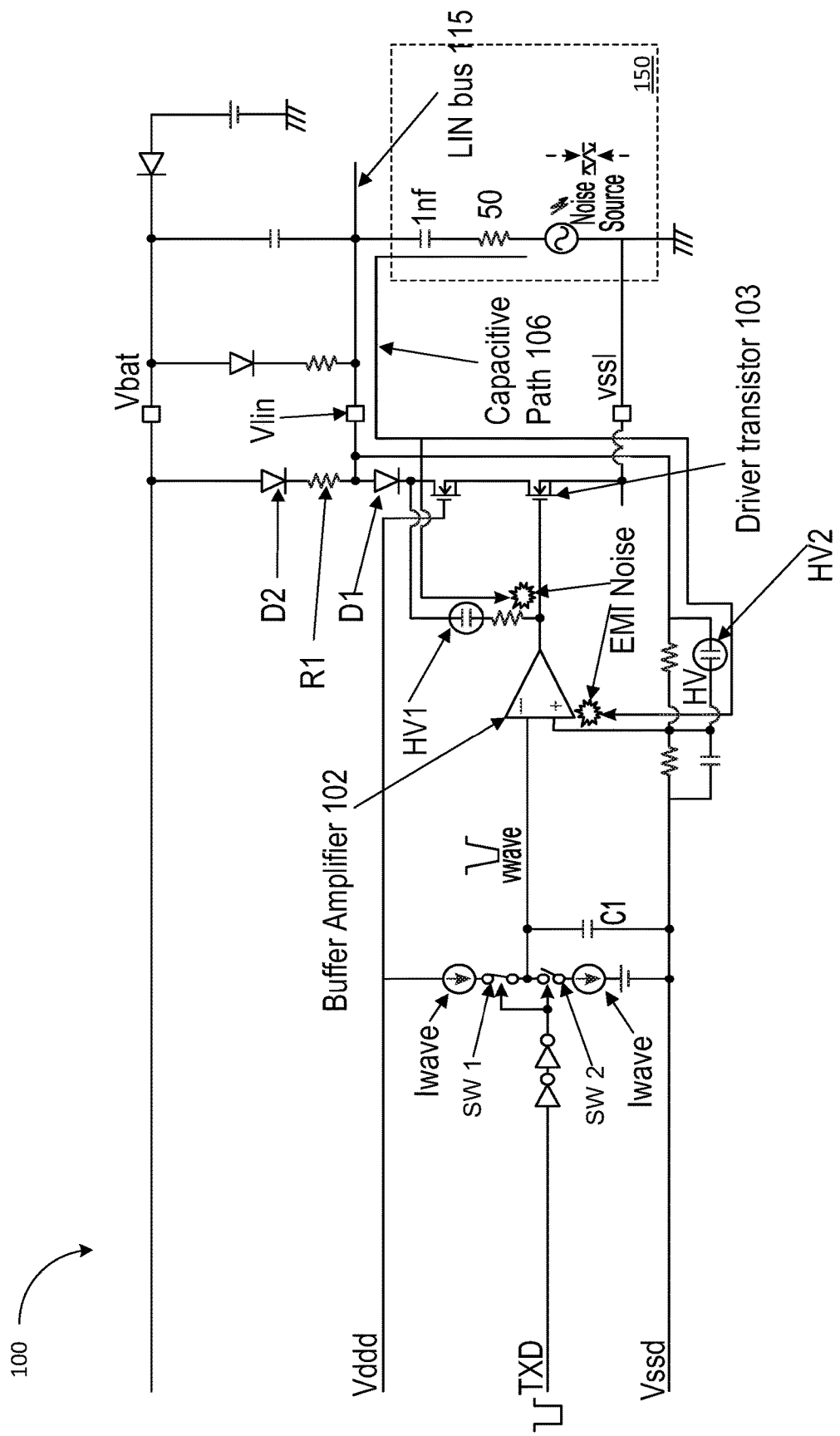
FIG. 2A illustrates a LIN driver circuit with a noise testing element coupled thereto, in accordance with some embodiments of the present disclosure.

FIG. 1B also illustrates HV capacitors HV 1 and HV 2, which provide phase compensation. However, as discussed above, the use of HV 1 and HV 2 decrease the EMI tolerance of the LIN driver circuit 100, and increase the cost due to manufacturing requirements and the large area required. FIG. 2A illustrates the LIN driver circuit 100 in an EMI tolerance test configuration with noise source circuit 150 coupled thereto, and shows the capacitive path 160 for EMI noise from the LIN bus 115 as a result of HV 1 and 2. This results in a decrease in the EMI tolerance of the LIN driver circuit 100, as discussed herein.

Figure 2B:
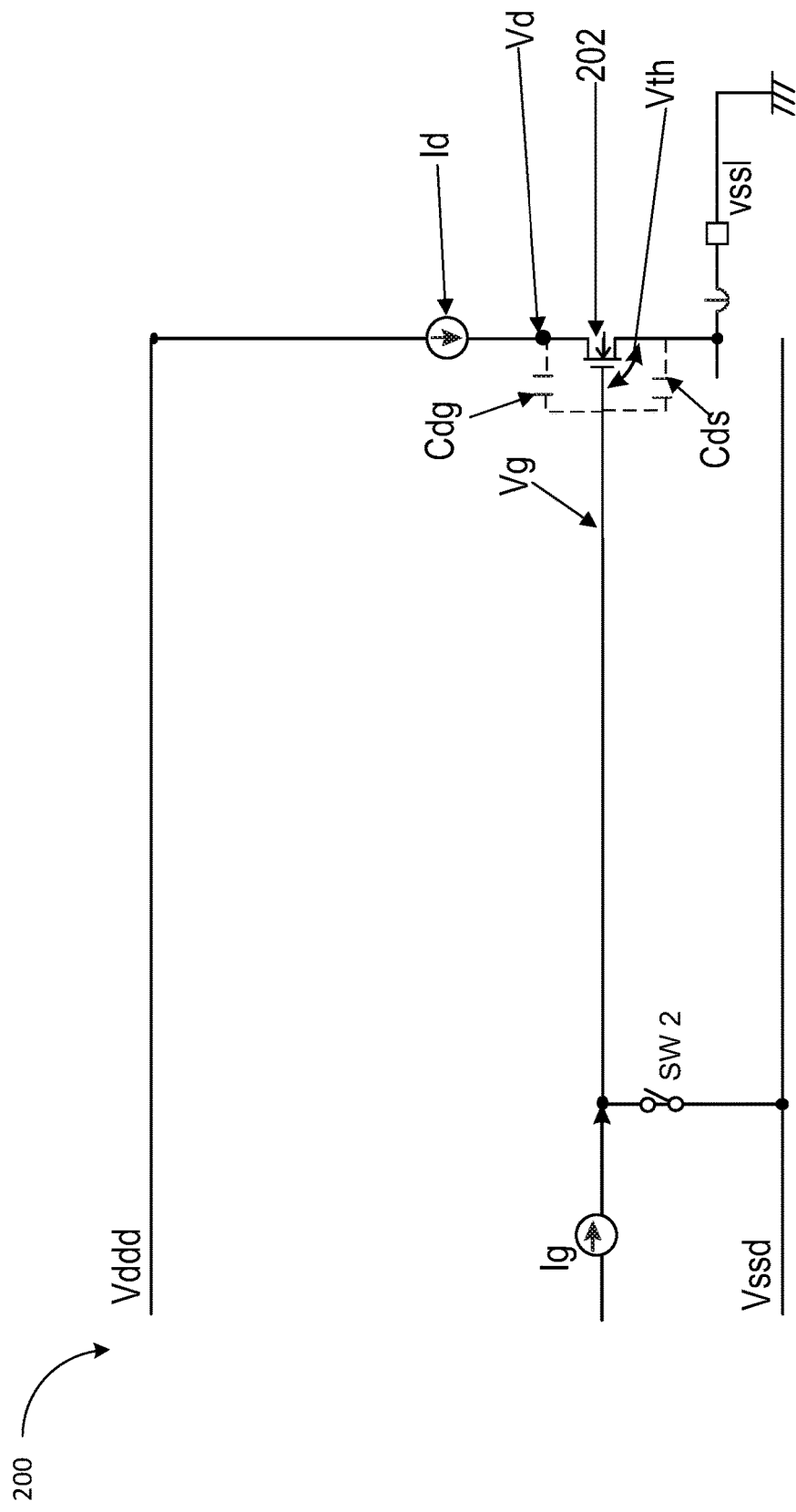
FIG. 2B illustrates a gate charge circuit, in accordance with some embodiments of the present disclosure.

FIG. 2B shows a gate charge circuit 200. When switch SW 2 turns off, current Ig is charged to the gate voltage of output transistor 202 (Vg) and Vg rises. When the rising Vg reaches the Thevenin voltage (Vth) of the output transistor 202, the drain current of the output transistor 202 (Id) flows, and the drain voltage of the output transistor 202 (Vd) starts to decrease. Since the output transistor 202 has parasitic gate capacitance (Cdg and Cgs), the decrease of Vd has the opposite effect as (e.g., a cancelling effect on) the increase of Vg due to capacitive coupling of Cdg. As a result, Vg is maintained around Vth until Vd finishes decreasing. This effect is known as the Miller effect. Keeping Vg constant (at Vth) during the decrease period of Vd means that Ig is flowing through Cdg. In other words, Cdg is discharged by Ig, so the slew rate of Vd can be calculated as shown below:

$$\frac{V_d}{t_2 - t_1} = \frac{I_g}{C_{dg}} \tag{1}$$

Figure 3A:
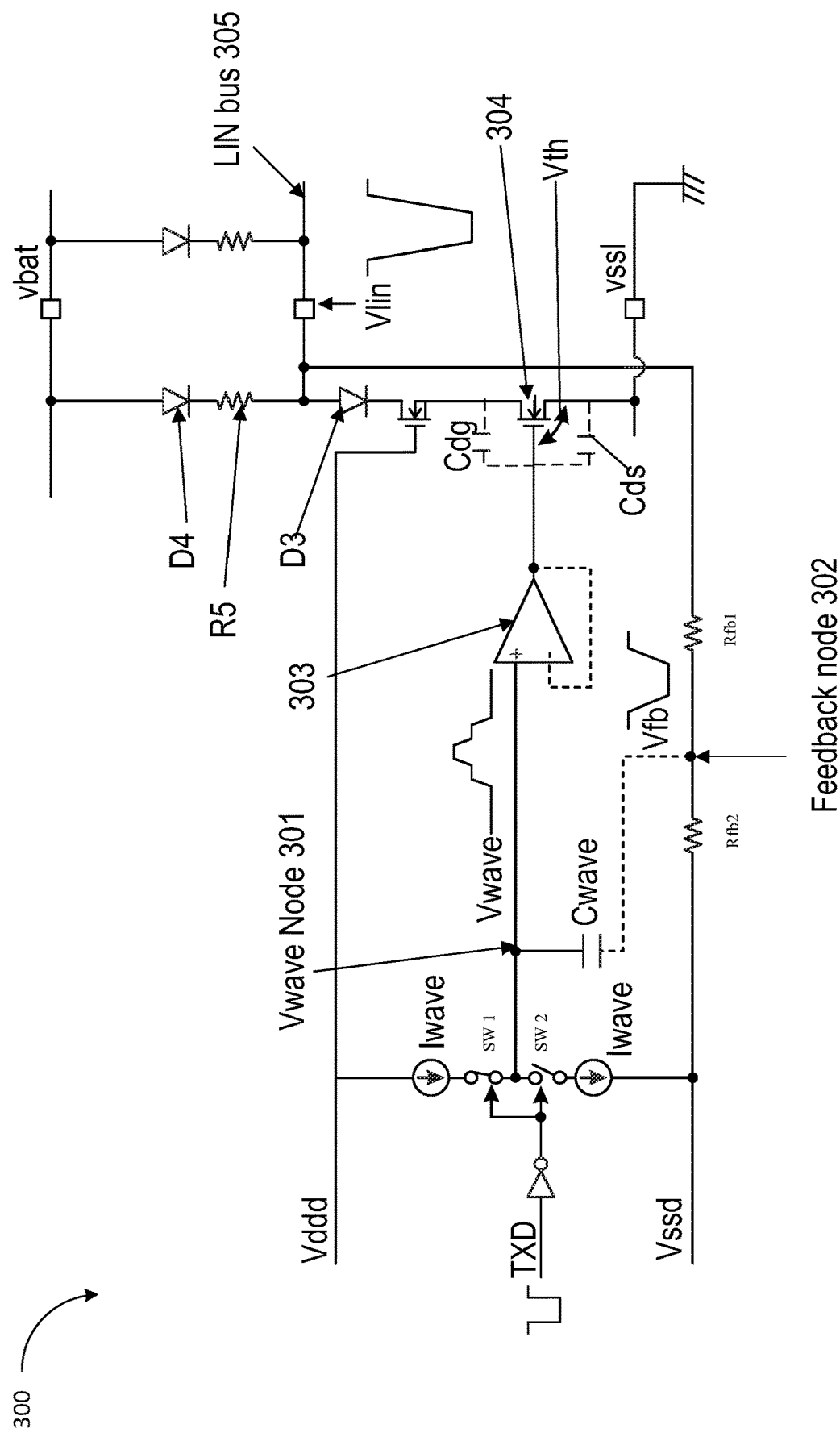
FIG. 3A illustrates a LIN driver circuit, in accordance with some embodiments of the present disclosure.

FIG. 3A illustrates a LIN driver circuit 300, in accordance with some embodiments of the present disclosure. Details such as bias circuits and offset voltages have been omitted for ease of description and illustration. As shown in FIG. 3A, capacitor Cwave may be coupled between the Vwave node 301 and the feedback node 302. In this way, the Miller effect occurs at the capacitor Cwave (as opposed to Cdg), and the slew rate (of Vlin) may be generated directly at the feedback node 302. For example, when switch SW 2 turns off, Iwave charges a linearly varying signal (Vwave) at the Vwave node 301 (e.g., by charging Cwave) and Vwave rises. When the rising Vwave reaches the Thevenin voltage of driver transistor 304 (Vth), the drain current of driver transistor 304 flows and the drain voltage of driver transistor 304 starts to decrease. Driver transistor 304 (also referred to as output transistor) may be any appropriate type of transistor. The drain voltage of driver transistor 304 may correspond to Vlin (also referred to as the drive signal), which is the voltage output by the driver transistor 304 to the LIN bus 305. Because capacitor Cwave is connected between Vwave node 301 and the feedback node 302 as shown in FIG. 3A, and the Miller effect now occurs at capacitor Cwave, (instead of Cdg) the decrease of Vlin essentially has the opposite effect as (e.g., a cancelling effect on) the increase of Vwave due to the capacitive coupling of Cwave. As a result, Vwave is maintained around Vth until Vlin finishes decreasing (Miller effect). The slew rate of Vlin can now be determined independently of the gate capacitance of driver transistor 304 (Cdg and Cgs). The voltage at the feedback node 302 (Vfb) taking into account the feedback resistances Rfb1 and Rfb2 is determined as follows:

$$V_{fb} = V_{lin} \frac{R_{fb2}}{R_{fb1} + R_{fb2}} \quad (2)$$

In some embodiments, the resistance value of Rfb1+Rfb2 must be small enough (e.g., Iwave<<Vlin/(Rfb1+Rfb2)), for the Miller effect to occur between Vwave node 301 and the feedback node 302 (e.g., at capacitor Cwave). The slew rate of Vfb is determined as follows:

$$\frac{V_{fb}}{t_2 - t_1} = \frac{I_{wave}}{C_{wave}} \quad (3)$$

From equations (2) and (3), the slew rate of Vlin is determined as follows:

$$\frac{\Delta V_{lin}}{\Delta t} \approx \frac{I_{wave}}{C_{wave} \cdot \frac{R_{fb2}}{R_{fb1} + R_{fb2}}} \quad (4)$$

(Iwave<<Vlin/(Rfb1+Rfb2))

For example, if Iwave=1.2 uA C1=10 pF Rfb1=90 kohm and Rfb2=10 kohm, the slew rate can be set to 1.2V/us. The current flowing into Rfb1 and Rfb2 is sufficiently larger than Iwave=1.2 uA, and the effect of Iwave can be ignored.

In addition, the parasitic drain gate capacitance (Cdg and Cgs) may cause EMI disturbance to couple to the gate of the driver transistor 304. Hence, the buffer amplifier 303 may be coupled so as to disable the gate capacitance of driver transistor 304. More specifically, the output of the buffer amplifier 303 may be connected to the inverting input terminal of the buffer amplifier 303 in a configuration referred to as "voltage follower," which is also known as an impedance converter (buffer), and the output impedance of the buffer amplifier 303 may be low. When SW 2 is turned off and Iwave charges Vwave, the Vwave voltage rises sharply because the input impedance of buffer amplifier 303 is high. Then, since the output impedance of buffer amplifier 303 is low, enough current is supplied to the gate of driver transistor 304, so the gate voltage of driver transistor 304 can also rise sharply and the slew rate of the output voltage Vlin (e.g., the drain voltage of driver transistor 304) also becomes steep. Thus, buffer amplifier 303 cancels out the effect of the gate capacitance (Cdg and Cgs) of driver transistor 304. Diodes D3 and D4 may perform the functions of diodes D1 and D2 (illustrated in FIG. 1B) respectively, and resistor R5 may be a pull-up resistor similar to resistor R1 illustrated in FIG. 1B.

Figure 3B:
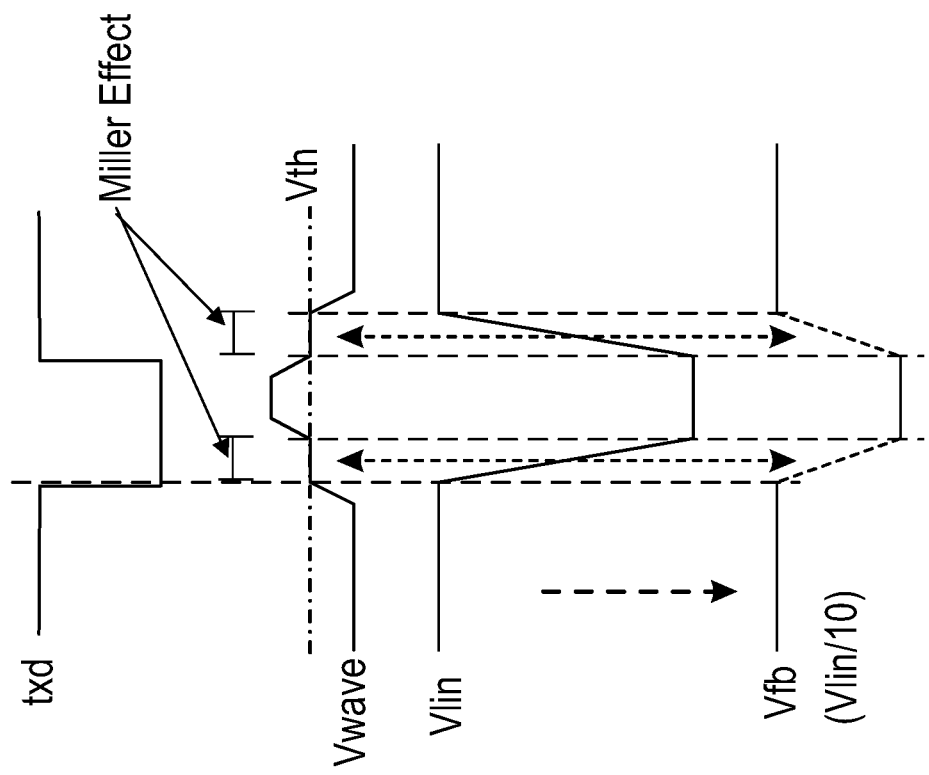
FIG. 3B illustrates a timing diagram of the operation of the LIN driver circuit of FIG. 3A, in accordance with some embodiments of the present disclosure.

FIG. 3B illustrates a waveform diagram of the LIN driver circuit 300's operation. Referring also to FIG. 3A, when TXD changes from high to low, switch SW 2 may turn off, thus using Iwave to charge Vwave at Vwave node 301. When Vwave reaches (rises to) Vth, the Vlin falls (as a result of the drain current of driver transistor 304 flowing) and thus the Vfb also falls. Due to the Miller effect occurring at Cwave, Vwave maintains Vth and the desired slew rate is generated at the feedback node 302.

When TXD changes from low to high, switch SW 2 is on and SW 1 is off, thus discharging Iwave from Vwave node 301. When Vwave reaches (falls to) Vth, the Vlin rises and thus the Vfb also rises. Due to the Miller effect occurring at Cwave, Vwave maintains Vth (since the lowering in Vwave is offset by the rise in Vlin) and the desired slew rate is generated at the feedback node 302.

Figure 4:
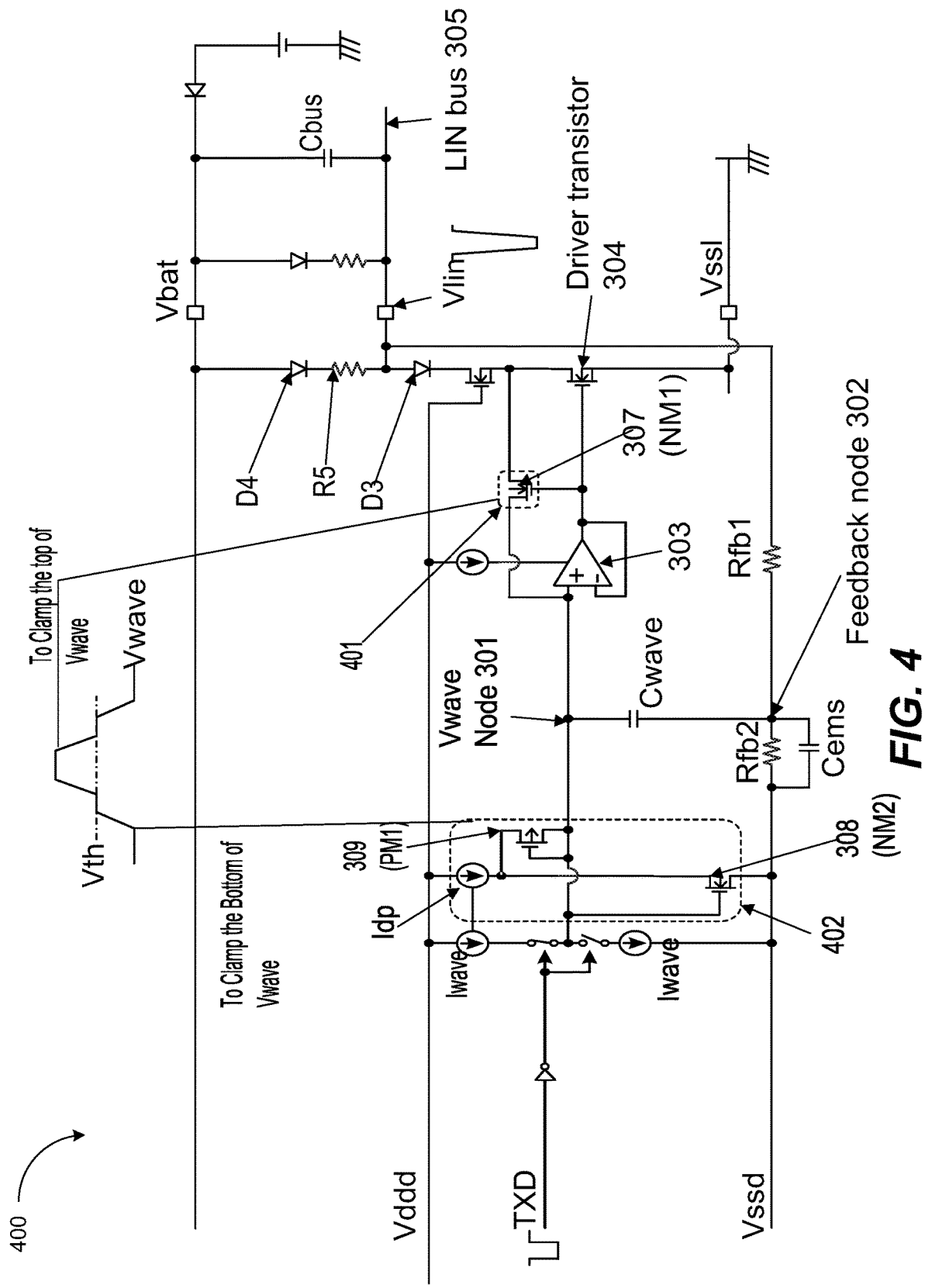
FIG. 4 illustrates a LIN driver circuit, in accordance with some embodiments of the present disclosure.

FIG. 4 shows a LIN driver circuit 400, in accordance with some embodiments of the present disclosure. The LIN driver circuit 400 may similar to the LIN driver circuit 300 illustrated in FIG. 3A, but may have additional clipping circuits 401 and 402 to clamp Vwave as well as EMS capacitor Cems, coupled between ground (Vssd) and the feedback node 302. Clipping circuit 401 may comprise a clamp transistor 307 coupled between the drain of driver transistor 304 and Vwave node 301. When Vlin falls below a threshold voltage (e.g., during charging of Vwave), the clamp transistor 307 may turn on automatically and prevent Vwave from rising any further. Thus clipping circuit 401 may function to clamp the top of the Vwave. Clipping circuit 402 may comprise clamp transistor 308 coupled between ground (vssd) and Vwave node 301, and clamp transistor 309 coupled between Vwave node 301 and Vddd. When Vwave falls below the Thevenin voltage of clamp transistor 308 (e.g., during discharging of Vwave), a current (Idp) may flow through clamp transistor 309, thus preventing Vwave from falling any further. Thus clipping circuit 402 may function to clamp the bottom of Vwave. Each of the clamp transistor 307, 308, and 309 may be any appropriate transistor configuration.

FIG. 4 also illustrates capacitor Cems, which may be coupled between ground (vssd) and feedback node 302. In this way, a low-pass filter comprising RFB1 and Cems may be realized. By tuning the low pass filter appropriately, the noise immunity of LIN driver circuit 400 may be improved. As can be seen, the LIN driver circuit 400 does not require HV capacitors and does not have capacitive paths for EMI noise from the LIN bus 305. LIN driver 400 may operate stably even if the LIN bus capacitor Cbus is lost.

Figure 5A:
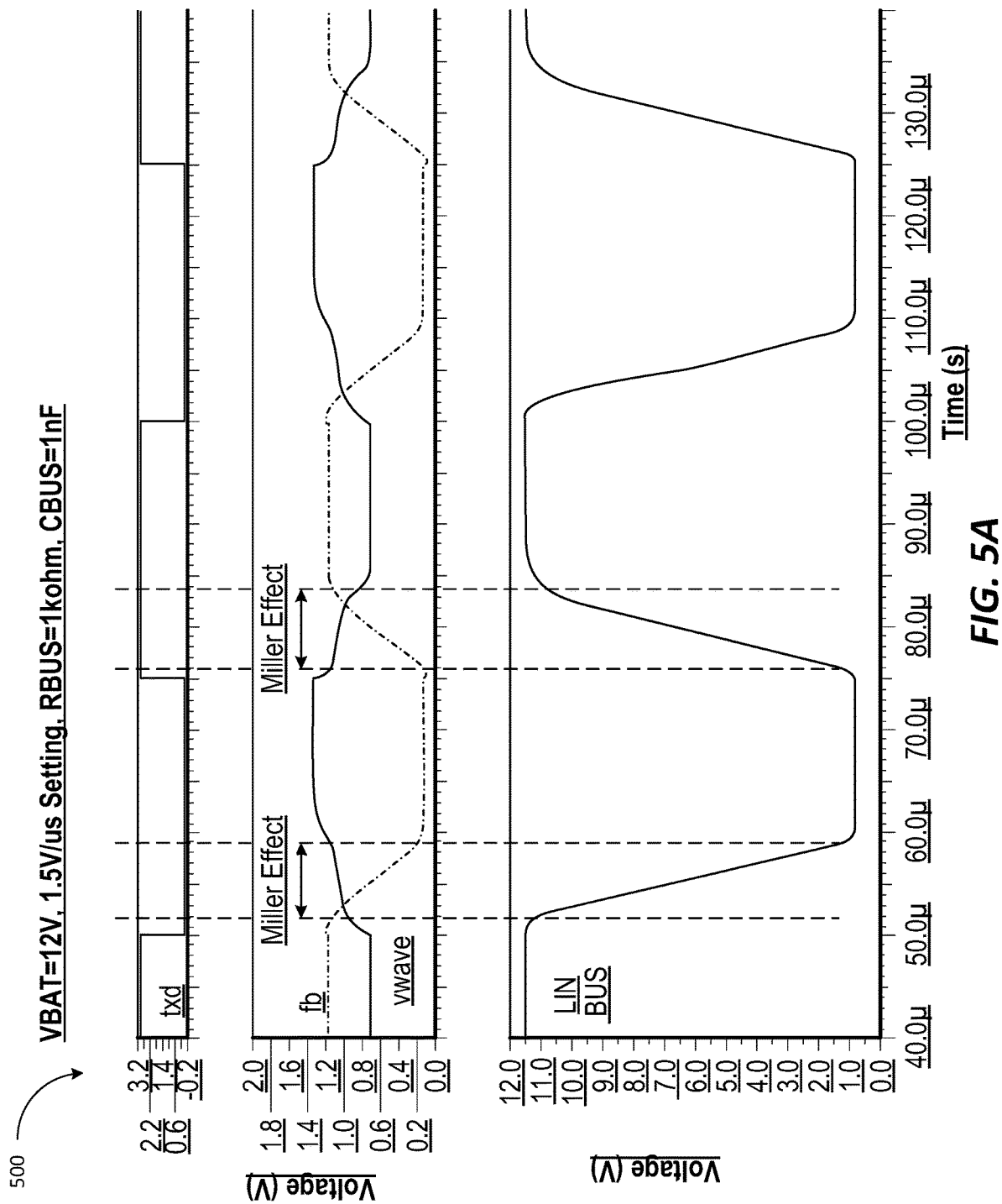
FIGS. 5A-5B illustrate transmit power diagrams of the LIN driver circuit of FIG. 4, in accordance with some embodiments of the present disclosure.
Figure 5B:
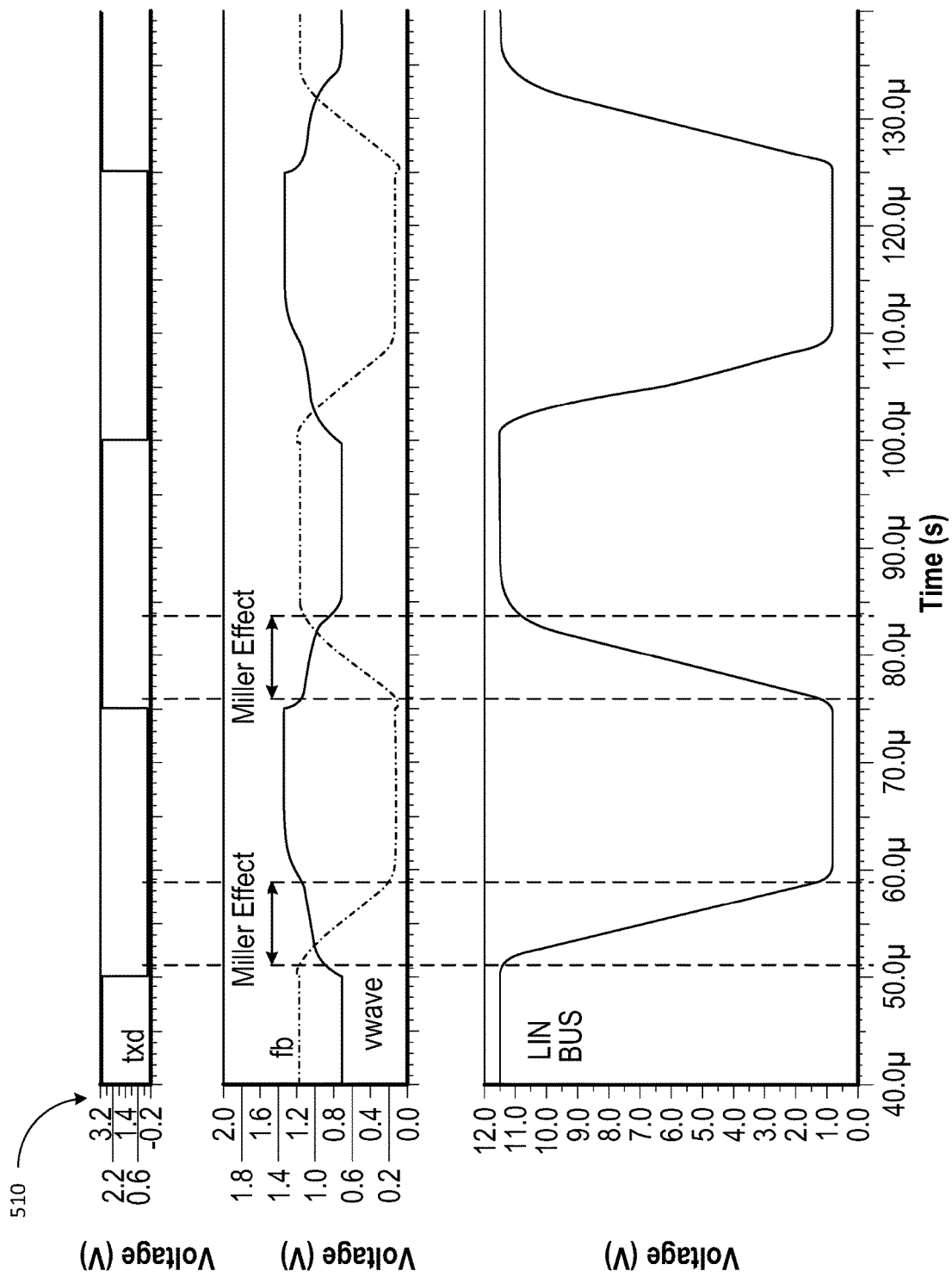

FIGS. 5A and 5B illustrate time/voltage plots 500 and 510 respectively for the LIN driver circuit 400 illustrated in FIG. 4.

Figure 6A:
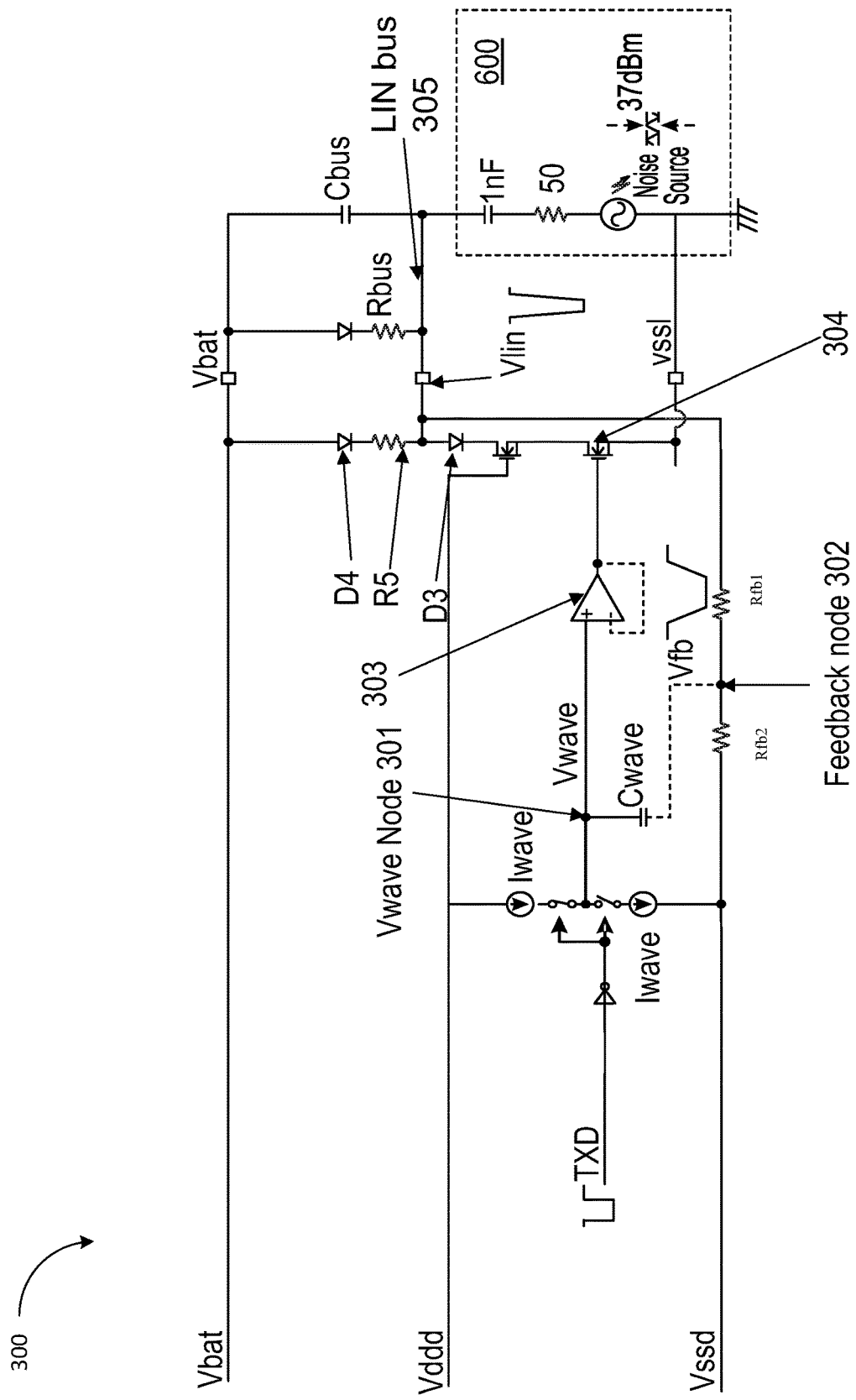
FIG. 6A illustrates a LIN driver circuit with a noise testing element coupled thereto, in accordance with some embodiments of the present disclosure.
Figure 6B:
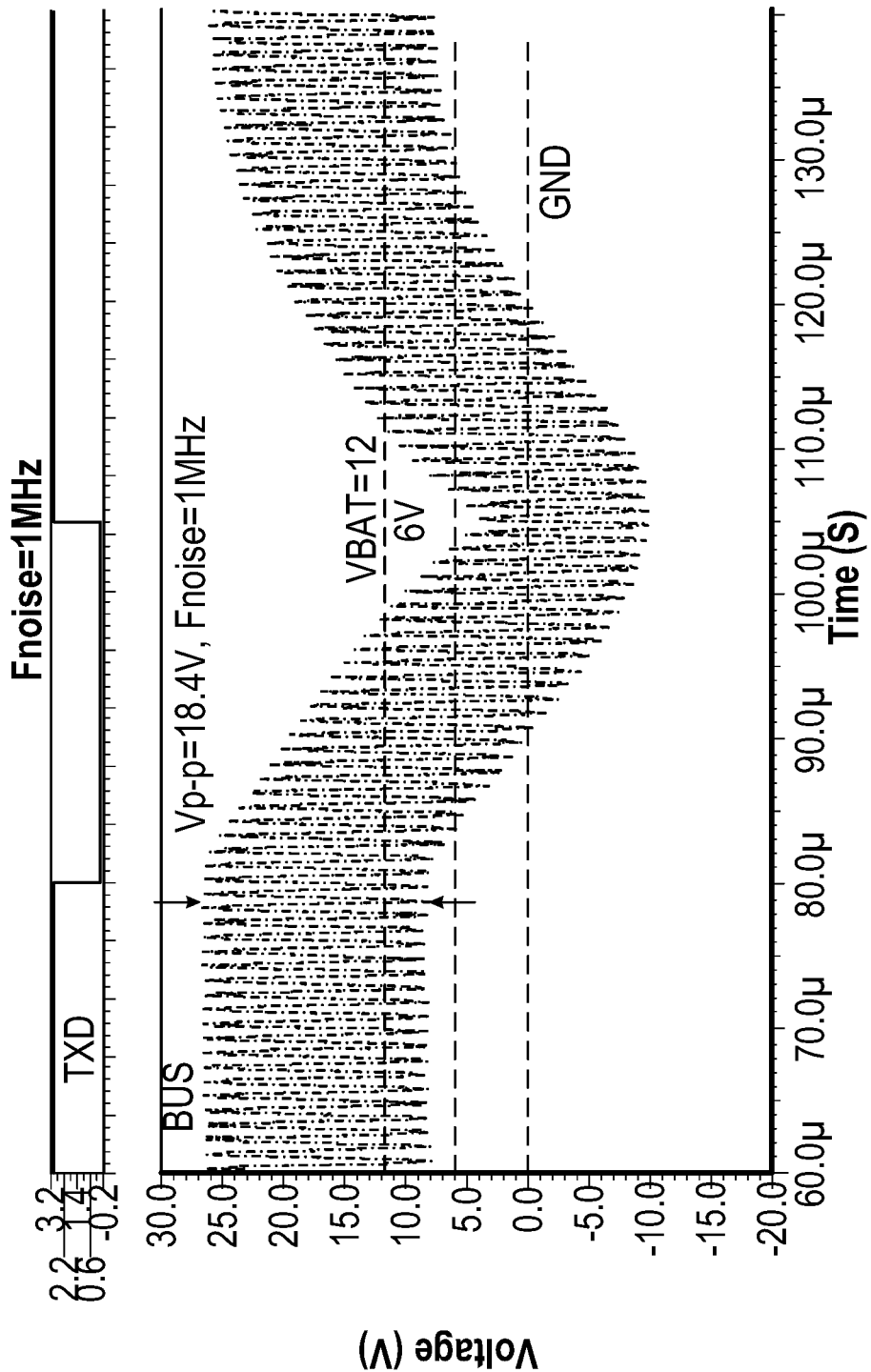
FIGS. 6B-6C illustrate noise performance diagrams of the LIN driver circuit of FIG. 6A, in accordance with some embodiments of the present disclosure.
Figure 6C:
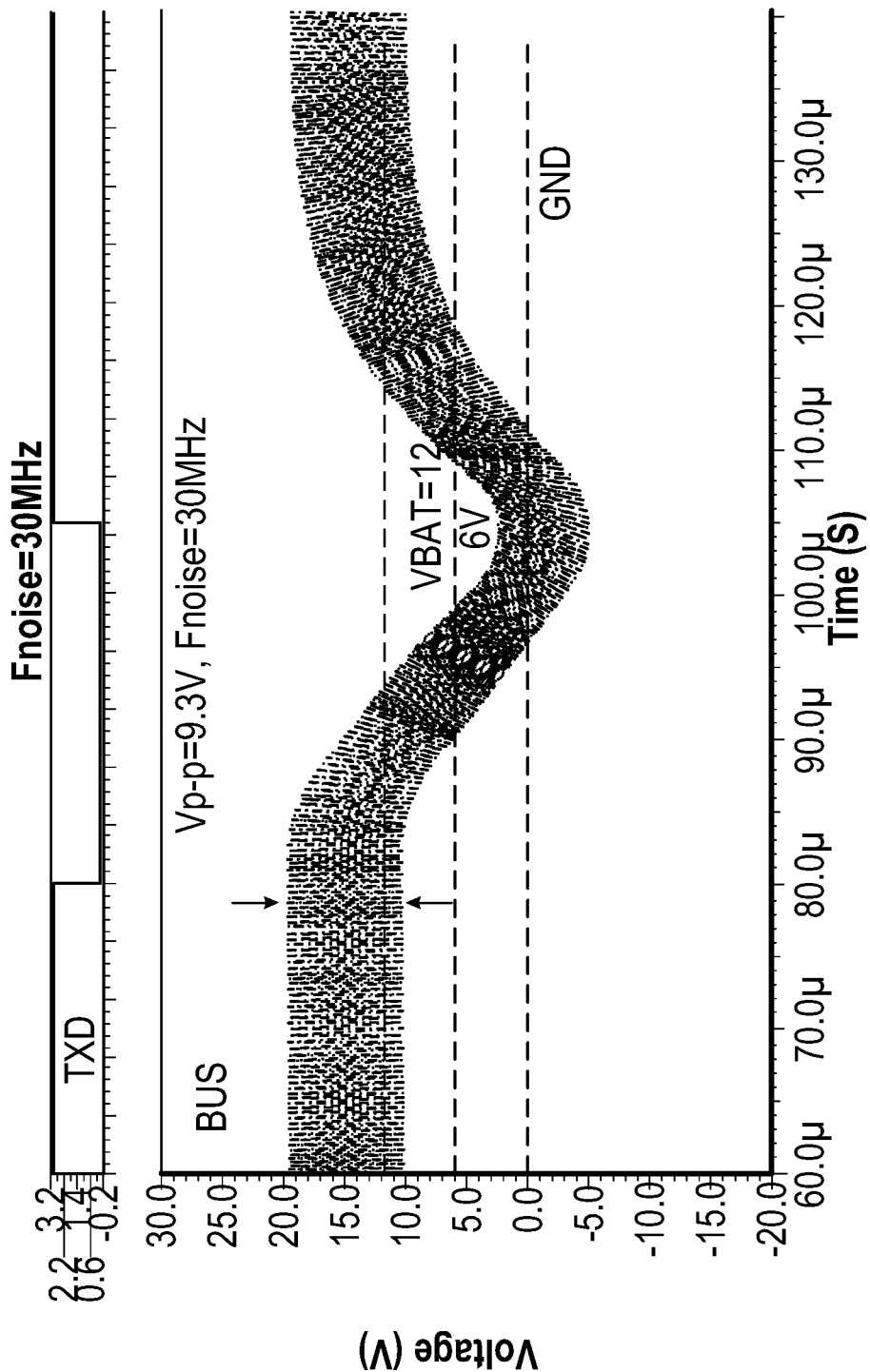

FIG. 6A illustrates the LIN driver 300 of FIG. 3A with a noise test circuit 600 coupled thereto. FIG. 6B illustrates the case of a noise test in which noise of peak to peak voltage (Vp-p) of 18.4V at 1 MHz is injected into the LIN bus 305, FIG. 6C illustrates the case of a noise test in which noise of peak to peak voltage (Vp-p) of 9.3V at 30 MHz is injected into the LIN bus 305. In either case, the LIN bus signal (Vlin) comprises a low level signal of 50% (6V) or less of VBAT (12V) and a high level signal of 50% (6V) or more of VBAT (12V) according to the TXD signal. Stated differently, Vlin can be successfully transmitted even under the above noise test conditions.

Figure 7A:
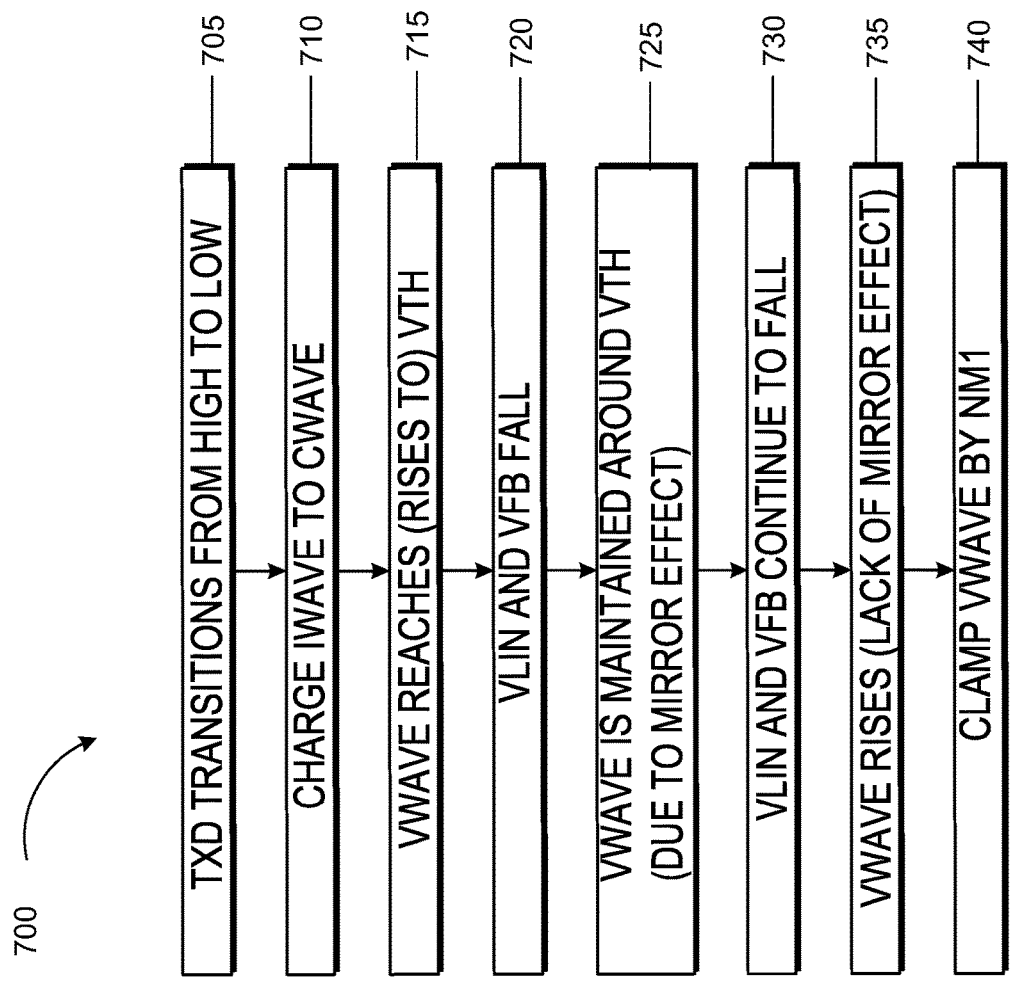
FIG. 7A illustrates a method of implementing a LIN driver circuit, in accordance with some embodiments of the present disclosure.

FIG. 7A is a flow diagram of a method 700 of operating a LIN driver circuit, such as LIN driver circuit 300 of FIG. 3A, in accordance with some embodiments. Method 700 may be performed by logic that may comprise hardware (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. For example, the method 700 may be performed by the LIN driver circuit 300 illustrated in FIG. 3A.

Referring simultaneously to FIGS. 3A and 3B, at block 705, when TXD changes from high to low, switch SW 2 may turn off, thus charging Iwave to Vwave node 301 (e.g., by charging Cwave) at block 710. At block 715, Vwave reaches (rises to) Vth, at which point the Vlin falls (as a result of the drain current of driver transistor 304 flowing) (block 720) and thus the Vfb also falls (Vfb may reduce gradually due to the mirror effect). At block 725, due to the Miller effect occurring at Cwave, Vwave is maintained at Vth (since the rise in Vwave is offset by the lowering of Vlin) and the desired slew rate for Vlin is generated at the feedback node 302. At block 730, Vlin and Vfb continue to fall to a lowest level (the falling slew rate of Vlin is based on Equation (4) due to the Miller effect). When Vlin and Vfb fall to the minimum level, the mirror effect disappears and at block 735, Vwave continues to rise due to lack of the mirror effect. At block 740, Vwave is clamped by e.g., clamping circuit 401 (illustrated in FIG. 4) which provides an upper limit on Vwave.

Figure 7B:
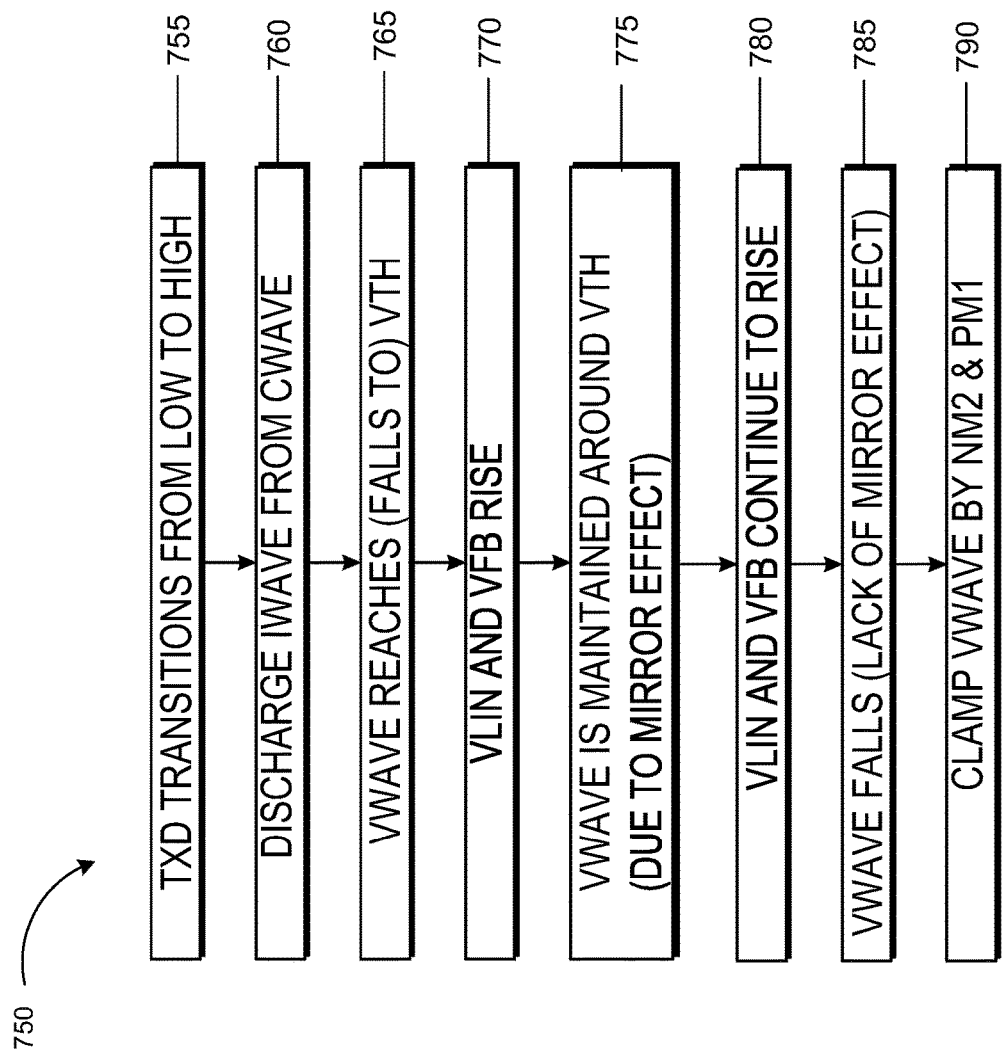
FIG. 7B illustrates a method of implementing a LIN driver circuit, in accordance with some embodiments of the present disclosure.

FIG. 7B is a flow diagram of a method 750 of implementing a LIN driver circuit, in accordance with some embodiments. Method 750 may be performed by logic that may comprise hardware (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. For example, the method 750 may be performed by the LIN driver circuit 300 illustrated in FIG. 3A.

Referring simultaneously to FIGS. 3A and 3B, at block 755, when TXD changes from low to high, switch SW 2 may turn on and switch SW 1 may turn off, thus discharging Iwave from Vwave node 301 at block 760. At block 765 the Vwave node 301 reaches (falls to) Vth, and at block 770 the Vlin rises and thus the Vfb also rises (Vfb may rise gradually due to the mirror effect). At block 775, due to the Miller effect occurring at Cwave, Vwave is maintained at Vth (since the lowering in Vwave is offset by the rise in Vlin) and the desired slew rate is generated at the feedback node 302. At block 780, as Vlin and Vfb continue to rise to a maximum level, (the rising slew rate of Vlin is based on Equation (4) due to the Miller effect). When Vlin and Vfb rise to the maximum level, the mirror effect disappears and at block 785 Vwave may fall due to the lack of mirror effect. At block 790, Vwave may be clamped by e.g., clamping circuit 402 (illustrated in FIG. 4) which provides a lower limit on Vwave.

Figure 8:
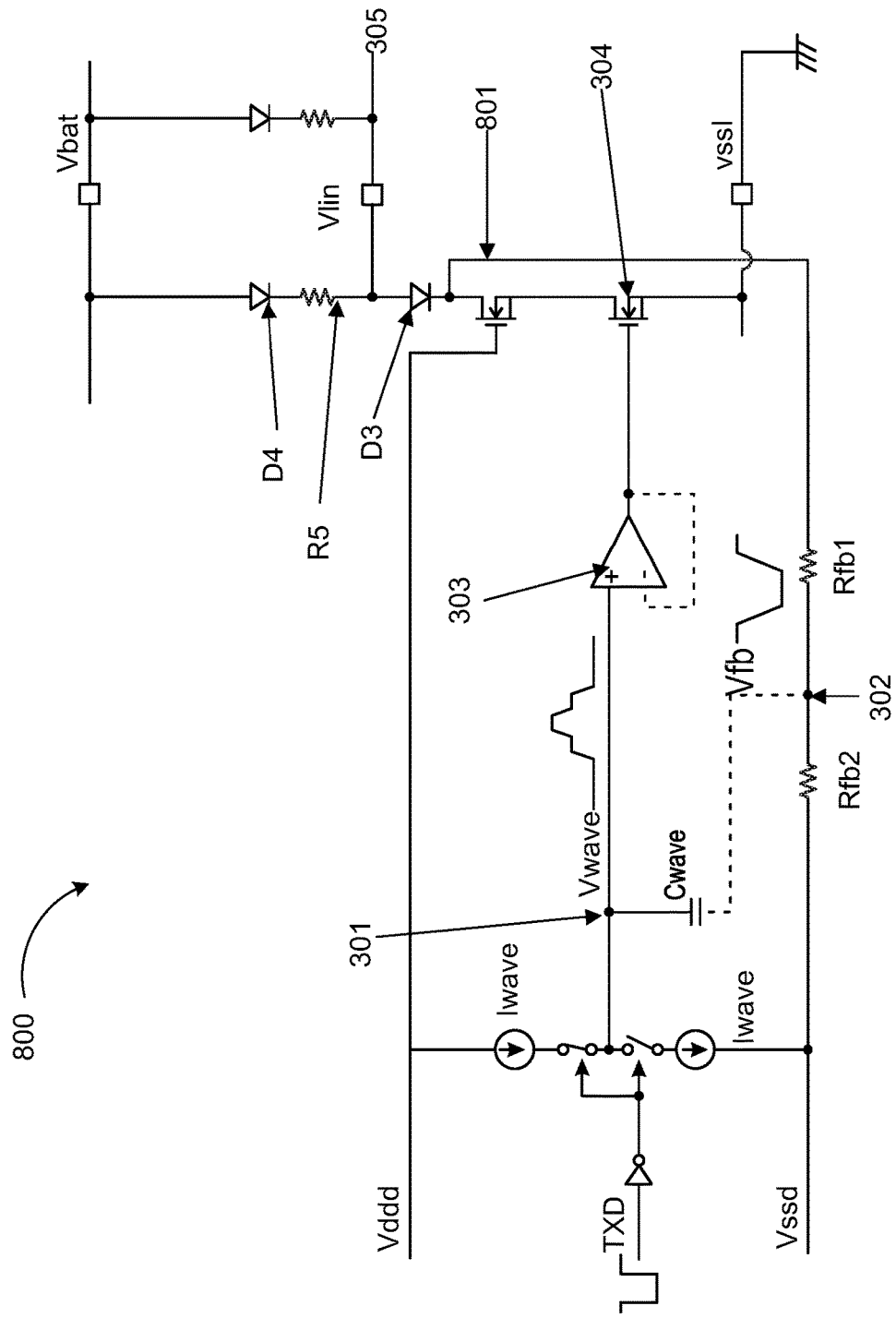
FIG. 8 illustrates a LIN driver circuit, in accordance with some embodiments of the present disclosure.

FIG. 8 illustrates a LIN driver circuit 800 in accordance with some embodiments of the present disclosure. LIN driver circuit 800 may be similar to LIN driver circuit 300 illustrated in FIG. 3A, except the feedback path 801 may be coupled to the cathode of diode D3. In this way, diode D3 may be used to prevent backflow (the reverse current of Rfb1 and Rfb2) during loss of ground.

Figure 9:
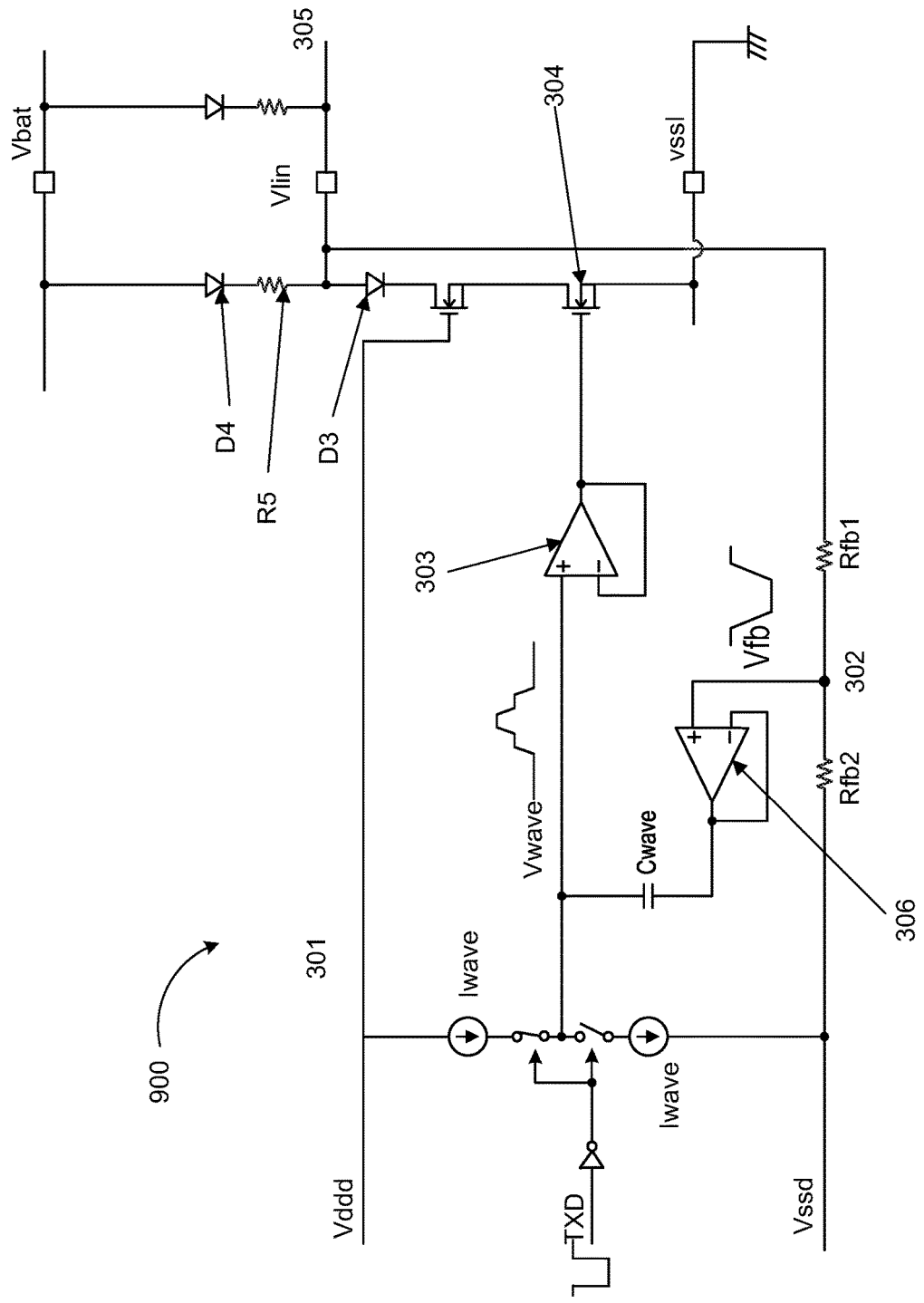
FIG. 9 illustrates a LIN driver circuit, in accordance with some embodiments of the present disclosure.

FIG. 9 illustrates a LIN driver circuit 900 in accordance with some embodiments of the present disclosure. The LIN driver circuit 900 may be similar to the LIN driver circuit 300 illustrated in FIG. 3A, but may have an additional buffer amplifier 306 coupled between the capacitor Cwave and the feedback node 302. The buffer amplifier 306 may be coupled in a "voltage follower" configuration similarly to buffer amplifier 303 and may further improve noise immunity of the LIN driver circuit 900 in a similar manner as buffer amplifier 303 (as discussed herein).

Figure 10:
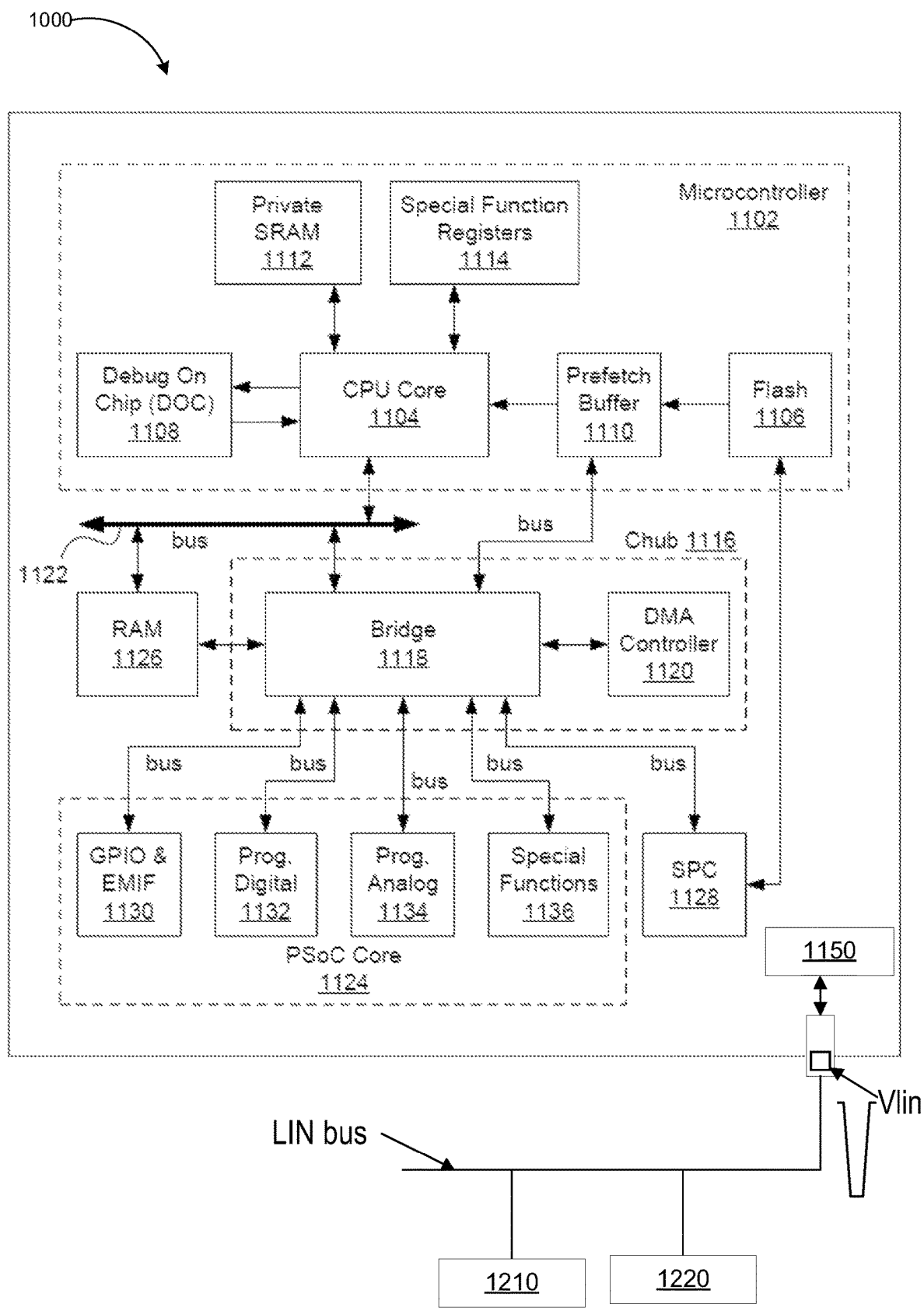
FIG. 10 illustrates an embodiment of a core architecture of a programmable processing device, in accordance with some embodiments of the present disclosure.

FIG. 10 illustrates an embodiment of a core architecture 1000 of a processing device, in which embodiments of the LIN driver circuit described herein may be implemented. FIG. 10 also illustrates the core architecture 1000 coupled to a LIN bus (e.g., LIN bus 305 illustrated in FIG. 3A). In one embodiment, the core architecture 1000 includes a microcontroller 1102. The microcontroller 1102 includes a CPU (central processing unit) core 1104 (which may correspond to processing device 130 of FIG. 1), flash program storage 1106, DOC (debug on chip) 1108, a prefetch buffer 1110, a private SRAM (static random access memory) 1112, and special functions registers 1114. In an embodiment, the DOC 1108, prefetch buffer 1110, private SRAM 1112, and special function registers 1114 are coupled to the CPU core 1104 (e.g., CPU core 1006), while the flash program storage 1106 is coupled to the prefetch buffer 1110.

The core architecture 1000 may also include a CHub (core hub) 1116, including a bridge 1118 and a DMA controller 1120 that is coupled to the microcontroller 1102 via bus 1122. The CHub 1116 may provide the primary data and control interface between the microcontroller 1102 and its peripherals (e.g., peripherals) and memory, and a programmable core 1124. The DMA controller 1120 may be programmed to transfer data between system elements without burdening the CPU core 1104. In various embodiments, each of these subcomponents of the microcontroller 1102 and CHub 1116 may be different with each choice or type of CPU core 1104. The CHub 1116 may also be coupled to shared SRAM 1126 and an SPC (system performance controller) 1128. The private SRAM 1112 is independent of the shared SRAM 1126 that is accessed by the microcontroller 1102 through the bridge 1118. The CPU core 1104 accesses the private SRAM 1112 without going through the bridge 1118, thus allowing local register and RAM accesses to occur simultaneously with DMA access to shared SRAM 1126. Although labeled here as SRAM, these memory modules may be any suitable type of a wide variety of (volatile or non-volatile) memory or data storage modules in various other embodiments. The core architecture 1000 may also include an analog front end 1138 that performs the measurement and digitizing of capacitance values (similar to the capacitance sensing circuit 125 illustrated in FIGS. 1A and 1B).

In various embodiments, the programmable core 1124 may include various combinations of subcomponents (not shown), including, but not limited to, a digital logic array, digital peripherals, analog processing channels, global routing analog peripherals, DMA controller(s), SRAM and other appropriate types of data storage, IO ports, and other suitable types of subcomponents. In one embodiment, the programmable core 1124 includes a GPIO (general purpose IO) and EMIF (extended memory interface) block 1130 to provide a mechanism to extend the external off-chip access of the microcontroller 1102, a programmable digital block 1132, a programmable analog block 1134, and a special functions block 1136, each configured to implement one or more of the subcomponent functions. In various embodiments, the special functions block 1136 may include dedicated (non-programmable) functional blocks and/or include one or more interfaces to dedicated functional blocks, such as USB, a crystal oscillator drive, JTAG, and the like.

The programmable digital block 1132 may include a digital logic array including an array of digital logic blocks and associated routing. In one embodiment, the digital block architecture is comprised of UDBs (universal digital blocks). For example, each UDB may include an ALU together with CPLD functionality.

In various embodiments, one or more UDBs of the programmable digital block 1132 may be configured to perform various digital functions, including, but not limited to, one or more of the following functions: a basic I2C slave; an I2C master; a SPI master or slave; a multi-wire (e.g., 3-wire) SPI master or slave (e.g., MISO/MOSI multiplexed on a single pin); timers and counters (e.g., a pair of 8-bit timers or counters, one 16 bit timer or counter, one 8-bit capture timer, or the like); PWMs (e.g., a pair of 8-bit PWMs, one 16-bit PWM, one 8-bit deadband PWM, or the like), a level sensitive I/O interrupt generator; a quadrature encoder, a UART (e.g., half-duplex); delay lines; and any other suitable type of digital function or combination of digital functions which can be implemented in a plurality of UDBs.

In other embodiments, additional functions may be implemented using a group of two or more UDBs. Merely for purposes of illustration and not limitation, the following functions can be implemented using multiple UDBs: an I2C slave that supports hardware address detection and the ability to handle a complete transaction without CPU core (e.g., CPU core 1104) intervention and to help prevent the force clock stretching on any bit in the data stream; an I2C multi-master which may include a slave option in a single block; an arbitrary length PRS or CRC (up to 32 bits); SDIO; SGPIO; a digital correlator (e.g., having up to 32 bits with 4× over-sampling and supporting a configurable threshold); a LINbus interface; a delta-sigma modulator (e.g., for class D audio DAC having a differential output pair); an I2S (stereo); an LCD drive control (e.g., UDBs may be used to implement timing control of the LCD drive blocks and provide display RAM addressing); full-duplex UART (e.g., 7-, 8- or 9-bit with 1 or 2 stop bits and parity, and RTS/CTS support), an IRDA (transmit or receive); capture timer (e.g., 16-bit or the like); deadband PWM (e.g., 16-bit or the like); an SMbus (including formatting of SMbus packets with CRC in software); a brushless motor drive (e.g., to support 6/12 step commutation); auto BAUD rate detection and generation (e.g., automatically determine BAUD rate for standard rates from 1200 to 115200 BAUD and after detection to generate required clock to generate BAUD rate); and any other suitable type of digital function or combination of digital functions which can be implemented in a plurality of UDBs.

The programmable analog block 1134 may include analog resources including, but not limited to, comparators, mixers, PGAs (programmable gain amplifiers), TIAs (trans-impedance amplifiers), ADCs (analog-to-digital converters), DACs (digital-to-analog converters), voltage references, current sources, sample and hold circuits, and any other suitable type of analog resources. The programmable analog block 1134 may include a programmable universal analog block (UAB) (not shown) which may be configured as one or more of the above mentioned analog resources as well as other types of analog resources such as analog filters and high resolution ADCs. The programmable analog block 1134 may support various analog functions including, but not limited to, analog routing, LCD drive IO support, capacitance-sensing, voltage measurement, motor control, current to voltage conversion, voltage to frequency conversion, differential amplification, light measurement, inductive position monitoring, filtering, voice coil driving, magnetic card reading, acoustic doppler measurement, echo-ranging, modem transmission and receive encoding, or any other suitable type of analog function.

The core architecture 1000 may be used for a variety of purposes including battery management, for example. The core architecture 1000 may also include a LIN physical interface 1150 which includes a LIN driver circuit (not shown), such as the LIN driver circuit 300 described with reference to FIG. 3A. The LIN physical interface 1150 (via its LIN driver circuit) may provide a drive signal (Vlin) to a LIN bus (e.g., LIN bus 305 of FIG. 3A) to allow the core architecture 1000 to communicate with other components (e.g., 1210, 1220) on the LIN bus, for example in an automotive environment.

In the above description, numerous details are set forth. It will be apparent, however, to one of ordinary skill in the art having the benefit of this disclosure, that embodiments of the present disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining," "detecting," "comparing," "resetting," "adding," "calculating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present embodiments. Thus, the specific details set forth above are merely exemplary. Particular implementations may vary from these exemplary details and still be contemplated to be within the scope of the present embodiments.

It is to be understood that the above description is intended to be illustrative and not restrictive. Many other embodiments will be apparent to those of skill in the art upon reading and understanding the above description. The scope of the embodiments should, therefore, be determined with reference to the appended claims, along with the full scope of equivalents to which such claims are entitled.

What is claimed is:

1. An apparatus comprising:
   a signal generation circuit configured to generate a linearly varying signal at a first node based on a clock signal;
   an output transistor configured to receive the linearly varying signal and output a drive signal to a bus;
   a first buffer amplifier coupled between the first node and a gate of the output transistor, the buffer amplifier configured to disable the gate capacitance of the output transistor;
   a second buffer amplifier coupled between the capacitor and the feedback node; and
   a capacitor coupled between the first node and a feedback node of the first buffer amplifier to generate a Miller effect at the capacitor, wherein a slew rate for the drive signal is generated at the feedback node.

2. The apparatus of claim 1, wherein when the linearly varying signal rises to a Thevenin voltage of the output transistor, the drive signal falls, and the linearly varying voltage stays at the Thevenin voltage of the output transistor based on the Miller effect, and when the linearly varying signal falls to the Thevenin voltage of the output transistor, the drive signal rises, and the linearly varying voltage stays at the Thevenin voltage of the output transistor based on the Miller effect.

3. The apparatus of claim 2, further comprising:
   a first clamp transistor coupled between a drain of the output transistor and the first node, wherein when the drive signal falls below a threshold, the first clamp transistor is configured to turn on to prevent the linearly varying signal from rising further;
   a second clamp transistor; and
   a third clamp transistor, wherein when the linearly varying signal falls below a Thevenin voltage of the third clamp transistor, current flows through the second clamp transistor to prevent the linearly varying signal from falling further.

4. The apparatus of claim 1, wherein the first buffer amplifier is coupled in a voltage follower configuration.

5. The apparatus of claim 1, wherein the second buffer amplifier is coupled between the capacitor and the feedback node in a voltage follower configuration.

6. A method comprising:
   in response to a clock signal transitioning from high to low, charging a linearly varying signal at a first node;
   in response to the linearly varying signal reaching a Thevenin voltage of an output transistor, maintaining a voltage of the linearly varying signal at the Thevenin voltage of the output transistor when a drive signal output by the output transistor falls based on a Miller effect occurring at a capacitor coupled between the first node and a feedback node, wherein a slew rate for the drive signal is generated at the feedback node; ad
   disabling the gate capacitance of the output transistor using a buffer amplifier coupled between the first node and a gate of the output transistor; and
   increasing noise immunity using a second buffer amplifier coupled between the capacitor and the feedback node.

7. The method of claim 6, further comprising:
   in response to the clock signal transitioning from low to high, discharging the linearly varying signal; and
   in response to the linearly varying signal falling to a Thevenin voltage of the output transistor, maintaining the voltage of the linearly varying signal at the Thevenin voltage of the output transistor when the drive signal output by the output transistor rises based on the Miller effect occurring at the capacitor coupled between the first node and the feedback node.

8. The method of claim 7, further comprising:
   in response to the drive signal falling below a threshold, turning on a first clamp transistor to prevent the linearly varying signal from rising further, wherein the first clamp transistor is coupled between a drain of the output transistor and the first node; and
   in response to the linearly varying signal falling below a Thevenin voltage of a third clamp transistor, preventing the linearly varying signal from falling further based on current flow through a second clamp transistor, the current flowing through the second clamp transistor in response to the linearly varying signal falling below a Thevenin voltage of the third clamp transistor.

9. The method of claim 6, wherein the buffer amplifier is coupled in a voltage follower configuration.

10. The method of claim 9, further comprising filtering noise using a low-pass filter comprising:
a feedback resistor coupled between ground and the feedback node; and
a second capacitor coupled between the ground and the feedback node.

11. The method of claim 6, wherein the second buffer amplifier is coupled between the capacitor and the feedback node in a voltage follower configuration.

12. A system comprising:
a processing device; and
a local interconnect network (LIN) bus coupled to the processing device to allow communication between the processing device and one or more other components on the LIN bus, wherein the processor includes a LIN driver circuit comprising:
a signal generation circuit configured to generate a linearly varying signal at a first node based on a clock signal;
an output transistor configured to receive the linearly varying signal and output a drive signal to a bus;
a first buffer amplifier coupled between the first node and a gate of the output transistor, the buffer amplifier configured to disable the gate capacitance of the output transistor;
a second buffer amplifier coupled between the capacitor and the feedback node; and
a capacitor coupled between the first node and a feedback node of the buffer amplifier to generate a Miller effect at the capacitor, wherein a slew rate for the drive signal is generated at the feedback node.

13. The system of claim 12, wherein when the linearly varying signal rises to a Thevenin voltage of the output transistor, the drive signal falls, and the linearly varying voltage stays at the Thevenin voltage of the output transistor based on the Miller effect, and when the linearly varying signal falls to the Thevenin voltage of the output transistor, the drive signal rises, and the linearly varying voltage stays at the Thevenin voltage of the output transistor based on the Miller effect.

14. The system of claim 13, wherein the LIN driver circuit further comprises:
a first clamp transistor coupled between a drain of the output transistor and the first node, wherein when the drive signal falls below a threshold, the first clamp transistor is configured to turn on to prevent the linearly varying signal from rising further;
a second clamp transistor; and
a third clamp transistor, wherein when the linearly varying signal falls below a Thevenin voltage of the third clamp transistor, current flows through the second clamp transistor to prevent the linearly varying signal from falling further.

15. The apparatus of claim 12, wherein the first buffer amplifier is coupled in a voltage follower configuration.

16. The system of claim 15, wherein the LIN driver circuit further comprises:
a feedback resistor coupled between ground and the feedback node; and
a second capacitor coupled between the ground and the feedback node, the second capacitor configured to form a low-pass filter with the feedback resistor.

* * * * *